United States Patent
Li et al.

(10) Patent No.: US 8,540,851 B2
(45) Date of Patent: Sep. 24, 2013

(54) PHYSICAL VAPOR DEPOSITION WITH IMPEDANCE MATCHING NETWORK

(75) Inventors: Youming Li, San Jose, CA (US); Jeffrey Birkmeyer, San Jose, CA (US); Takamichi Fujii, Minami-Ashigara (JP); Takayuki Naono, Kanagawa-ken (JP); Yoshikazu Hishinuma, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 756 days.

(21) Appl. No.: 12/389,253

(22) Filed: Feb. 19, 2009

(65) Prior Publication Data
US 2010/0206718 A1  Aug. 19, 2010

(51) Int. Cl.
*C23C 14/34* (2006.01)
*C23C 14/56* (2006.01)

(52) U.S. Cl.
USPC .............................. 204/192.22; 204/298.08

(58) Field of Classification Search
USPC ............. 204/192.12, 192.15, 192.18, 192.22, 204/298.08, 298.13
See application file for complete search history.

(56) References Cited

U.S. PATENT DOCUMENTS

| | | | |
|---|---|---|---|
| 3,617,459 A | | 11/1971 | Logan |
| 4,036,723 A | * | 7/1977 | Schwartz et al. ........ 204/192.22 |
| 4,131,533 A | | 12/1978 | Bialko et al. |
| 4,584,079 A | | 4/1986 | Lee et al. |
| 4,622,122 A | | 11/1986 | Landau |
| 5,092,978 A | | 3/1992 | Kojima et al. |
| 5,198,090 A | | 3/1993 | Galicki et al. |
| 5,910,886 A | | 6/1999 | Coleman |
| 5,986,875 A | | 11/1999 | Donde et al. |
| 6,387,225 B1 | * | 5/2002 | Shimada et al. ......... 204/192.18 |
| 6,471,830 B1 | | 10/2002 | Moslehi et al. |
| 6,533,906 B2 | | 3/2003 | Kawakubo et al. |
| 6,579,426 B1 | * | 6/2003 | van Gogh et al. ........ 204/298.08 |
| 2002/0195332 A1 | | 12/2002 | Burton et al. |
| 2003/0042131 A1 | | 3/2003 | Johnson |
| 2003/0058547 A1 | | 3/2003 | Hori et al. |
| 2003/0180450 A1 | | 9/2003 | Kidd et al. |
| 2005/0145479 A1 | | 7/2005 | Karlsson |
| 2006/0169582 A1 | | 8/2006 | Brown et al. |
| 2006/0231526 A1 | | 10/2006 | Donohue |
| 2007/0138906 A1 | | 6/2007 | Tsukamoto |

(Continued)

FOREIGN PATENT DOCUMENTS

| | | |
|---|---|---|
| EP | 1 953 840 A2 | 8/2008 |
| JP | 06-145972 | 5/1994 |
| JP | 07-109562 | 4/1995 |
| JP | 09-176850 | 7/1997 |
| JP | 2002-129320 | 5/2002 |
| JP | 2006-265651 | 10/2006 |

OTHER PUBLICATIONS

International Search Report and the Written Opinion for Application No. PCT/US10/24549, dated Apr. 12, 2010, 11 pages.

(Continued)

*Primary Examiner* — Mark F Huff
*Assistant Examiner* — John S Ruggles
(74) *Attorney, Agent, or Firm* — Fish & Richardson P.C.

(57) ABSTRACT

A method of physical vapor deposition includes applying a radio frequency signal to a cathode in a physical vapor deposition apparatus, wherein the cathode includes a sputtering target, electrically connecting a chuck in the physical vapor deposition apparatus to an impedance matching network, wherein the chuck supports a substrate, and wherein the impedance matching network includes at least one capacitor, and depositing material from the sputtering target onto the substrate.

21 Claims, 8 Drawing Sheets

(56) References Cited

U.S. PATENT DOCUMENTS

| | | |
|---|---|---|
| 2007/0218623 A1 | 9/2007 | Chua et al. |
| 2008/0083611 A1* | 4/2008 | Felmetsger .............. 204/192.15 |
| 2008/0231667 A1 | 9/2008 | Arakawa et al. |
| 2008/0236493 A1 | 10/2008 | Sakao |
| 2009/0057135 A1 | 3/2009 | Fujii et al. |
| 2010/0147680 A1 | 6/2010 | Li et al. |
| 2010/0147681 A1 | 6/2010 | Li et al. |
| 2010/0206713 A1 | 8/2010 | Li et al. |
| 2010/0206714 A1 | 8/2010 | Li et al. |

OTHER PUBLICATIONS

Vossen, John L. and Cuomo, J. J., "Glow Discharge Sputter Deposition," Thin Film Processes, Academic Press, 1978 (pp. 26-31).

Vossen, John L. and Kern, Werner, "Glow Discharge Sputter Deposition," Thin Film Processes, Academic Press, 1978 (pp. 50-51, and 54-59).

European Search Report for Application No. 10744283.2, mailed Jun. 4, 2013, 7 pages.

* cited by examiner

FIG. 3A

PHYSICAL VAPOR DEPOSITION WITH IMPEDANCE MATCHING NETWORK

TECHNICAL FIELD

The present disclosure relates generally to radio frequency (RF) sputtering physical vapor deposition (PVD).

BACKGROUND

Radio frequency sputtering PVD is a method for depositing a thin film on a substrate. The substrate is placed in a vacuum chamber facing a target that is connected to an RF power supply. When the RF power is initiated, a plasma is formed. Positive gas ions are pulled to the target surface, strike the target, and remove target atoms by momentum transfer. The removed target atoms then deposit on the substrate to form a thin film layer. During physical vapor deposition, it can be important to control the properties of the deposited thin film.

SUMMARY

In general, in one aspect, a method of physical vapor deposition includes applying a radio frequency signal to a cathode in a physical vapor deposition apparatus, wherein the cathode includes a sputtering target, electrically connecting a chuck in the physical vapor deposition apparatus to an impedance matching network, wherein the chuck supports a substrate, and wherein the impedance matching network includes at least one capacitor, and depositing material from the sputtering target onto the substrate.

This and other embodiments can optionally include one or more of the following features. The method of physical vapor deposition can include adjusting a capacitance of the at least one capacitor such that a positive self bias direct current voltage is generated on the substrate. Adjusting the capacitance of the at least one capacitor can include adjusting the capacitance to have a magnitude of between 10 pF and 500 pF. The positive self bias direct current voltage can be between 10 and 100V, such as approximately 60V.

The method of physical vapor deposition can include selecting a capacitance for the at least one capacitor such that a positive self bias direct current voltage is generated on the substrate. The capacitance can be selected to be between 10 pF and 500 pF. The positive self bias direct current voltage can be between 10 and 100V, such as approximately 60V.

The radio frequency signal can have a radio frequency power having a magnitude of between 1000 W and 5000 W, such as 3000 W. The target can include a dielectric material. The dielectric material can include lead zirconate titanate ("PZT"). Depositing material from the sputtering target onto the substrate can include creating a thin film having a thickness of between 2000 Å and 10 µm, such as between 2 µm and 4 µm. Depositing material from the sputtering target onto the substrate can include creating a thin film having a (100) crystalline structure.

In general, in one aspect, a physical vapor deposition apparatus includes a vacuum chamber having side walls, a cathode inside the vacuum chamber, wherein the cathode is configured to include a sputtering target, a radio frequency power supply configured to apply a radio frequency signal to the cathode, an anode inside and electrically connected to the side walls of the vacuum chamber, an impedance matching network, and a chuck inside the vacuum chamber, wherein the chuck is configured to support a substrate and is electrically connected to the impedance matching network.

This and other embodiments can optionally include one or more of the following features. The impedance matching network can include at least one capacitor. The impedance matching network can include an input terminal electrically connected to the chuck, a first capacitor electrically connected to ground, an inductor electrically connected between the input terminal and the first capacitor, and a second capacitor electrically connected between the input terminal and ground, the second capacitor being in parallel with the inductor and the first capacitor. The impedance matching network can include a variable tune capacitor and a shunt capacitor. The target can include a dielectric material. The dielectric material can include lead zirconate titanate ("PZT"). The cathode can include a magnetron assembly.

Creating a positive self bias DC voltage on the substrate either by locking the difference in phase between a first radio frequency signal on the cathode and a second radio frequency signal on the substrate or by connecting an impedance network to the chuck can result in the formation of thin films having advantageous piezoelectric and dielectric properties, such as PZT thin films having a dielectric constant in the range of 1000 to 1700, a high d31 coefficient, and a high break-down voltage. Likewise, creating a negative self bias using a phase shifter or an impedance matching network can be advantageous for re-sputtering, or etching, of deposited thin films, particularly PZT thin films.

The details of one or more embodiments are set forth in the accompanying drawings and the description below. Other features, aspects, and advantages will become apparent from the description, the drawings, and the claims.

BRIEF DESCRIPTION OF THE DRAWINGS

FIG. 3A is a schematic of a cross-section of an embodiment of a physical vapor deposition apparatus including an RF phase shifter and an extended shield.

Like reference numbers and designations in the various drawings indicate like elements.

DETAILED DESCRIPTION

When RF physical vapor deposition, or sputtering, is used to create a thin film on a substrate, it can be difficult to control the properties of the deposited film. By altering the DC self bias of the substrate, for example by locking the phase difference between an RF signal applied to the cathode and an RF signal applied to the chuck or by electrically connecting an impedance matching network to the chuck, the properties of the film can be better controlled.

Figure 1A:
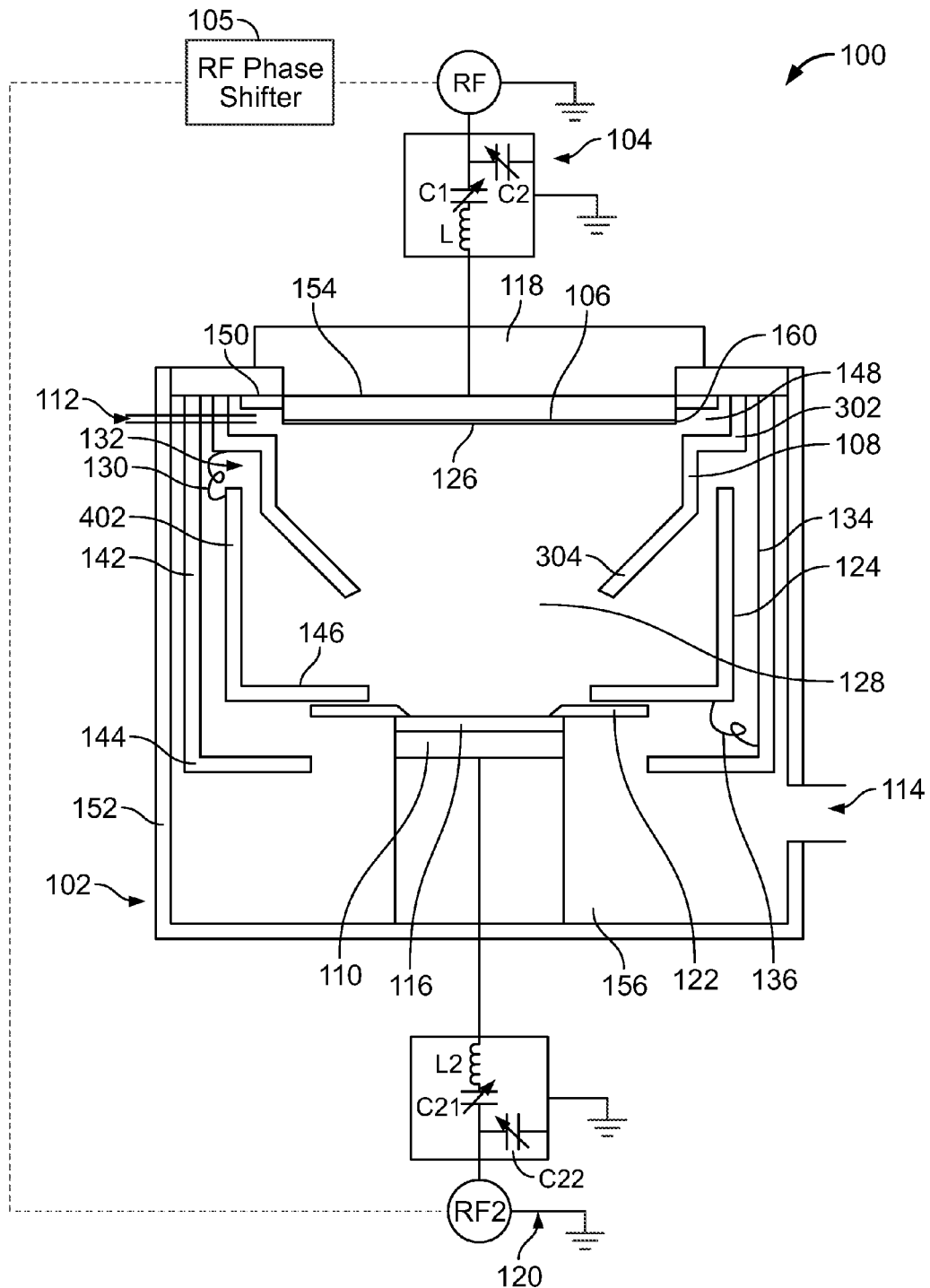
FIG. 1A is a schematic of a cross-section of an embodiment of a physical vapor deposition apparatus including an RF phase shifter and an extended anode.

Referring to FIG. 1A, a physical vapor deposition apparatus 100 can include a vacuum chamber 102. The vacuum chamber 102 can be cylindrical and have side walls 152, a top surface 154, and bottom surface 156. A magnetron assembly 118 can be located at the top of vacuum chamber 102. The magnetron assembly 118 can include a set of magnets having alternating magnetic poles. The magnetron assembly 118 can be stationary or can rotate about an axis perpendicular to a radius of vacuum chamber 102. The physical vapor deposition apparatus 100 can further include an RF power supply 104 and a corresponding load matching network, which can match the impedance of the power supply 104 to that of vacuum chamber 102.

A cathode assembly 106 can be housed inside and near the top surface 154 of vacuum chamber 102. Cathode assembly 106 can include a target 126 that can be bonded to a metallic backing plate (not shown). The target 106 can be generally circular, with an outer edge 160. The target can be made of, for example, a dielectric material such as lead zirconate titanate ("PZT"). Cathode 106 can act as an electrode for RF current when RF power is applied by RF power supply 104. Cathode assembly 106 can be electrically isolated from the vacuum chamber 102 by an insulator ring 150.

A substrate support or chuck 110 to support one or more substrates can be housed inside vacuum chamber 102 near, but spaced above, the bottom surface 156 of the vacuum chamber 102. The chuck 110 can include a substrate holding mechanism 122, such as a substrate clamping plate, configured to hold substrate 116 such that substrate 116 can be coated with a thin film during the PVD process. Substrate 116 can be, for example, a microelectromechanical system (MEMS) wafer. A temperature control (not shown) can be located on the chuck 110 to, for example, maintain the temperature of substrate 116 at a prescribed temperature between 25° C. and 800° C., such as 650° C. to 700° C.

In one embodiment, shown in FIG. 1A, the chuck 110 can be electrically isolated or floating from ground, and an RF power supply 120 can be electrically connected to chuck 110 (the RF power supply 120 can be connected to ground). An RF phase shifter 105 can be connected between RF power supply 120 and RF power supply 104. RF power supply 104 can serve as a phase reference to RF power supply 120 when phase shifter 105 is activated.

Figure 1B:
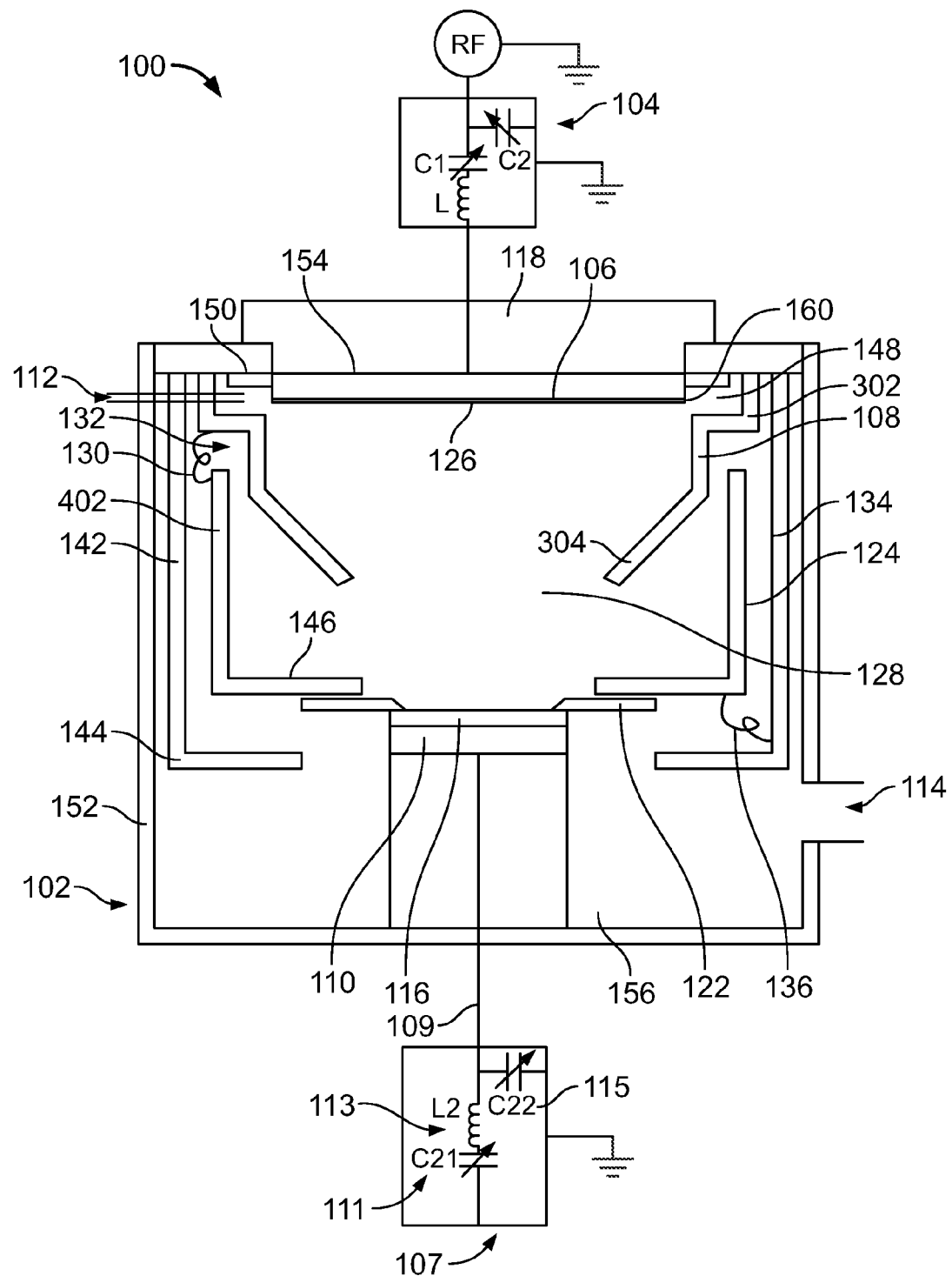
FIG. 1B is a schematic of a cross-section of an embodiment of a physical vapor deposition apparatus including an impedance matching network and an extended anode.

In another embodiment, shown in FIG. 1B, chuck 110 can be electrically isolated or floating from ground, and an impedance matching network 107 can be electrically connected to chuck 110 (the impedance matching network 107 can be connected to ground). No secondary RF power supply is connected to chuck 110. The impedance matching network 107 can include an input terminal 109, a variable tune capacitor 111, an inductor 113, and a shunt capacitor 115. The input terminal 109 can be electrically connected to chuck 110. The variable tune capacitor 111 can be electrically connected to ground. The inductor 113 can be electrically connected between input terminal 109 and variable tune capacitor 111. The shunt capacitor 115 can be electrically connected between input terminal 109 and ground and can be in parallel with inductor 113 and variable tune capacitor 111.

An anode 108 can also be housed inside vacuum chamber 102. The anode 108 can provide a counterpart electrode to the cathode 106 so as to provide an RF current return path. In some embodiments, the anode 108 and the chuck 110 can be the same component. In other embodiments, however, as described herein, the anode 108 may be electrically isolated from the chuck 110 so that the chuck 110 can be floating or held at a different potential than the anode 108. The anode can be grounded, i.e., electrically connected in this context (the anode need not be actually connected to ground), to the vacuum chamber sidewalls 152.

Figure 1C:
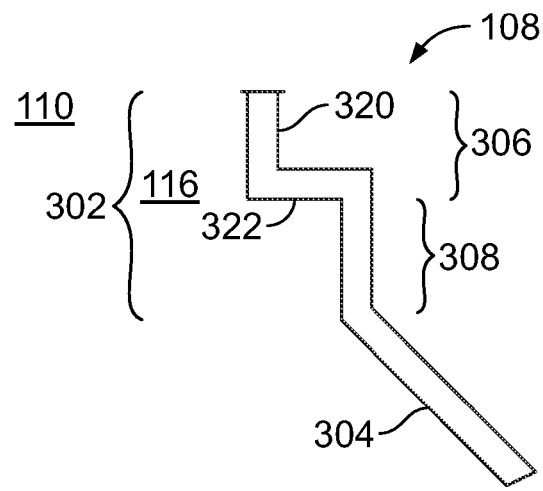
FIG. 1C is an enlarged view of the extended anode of FIGS. 1A and 1B.
Figure 2:
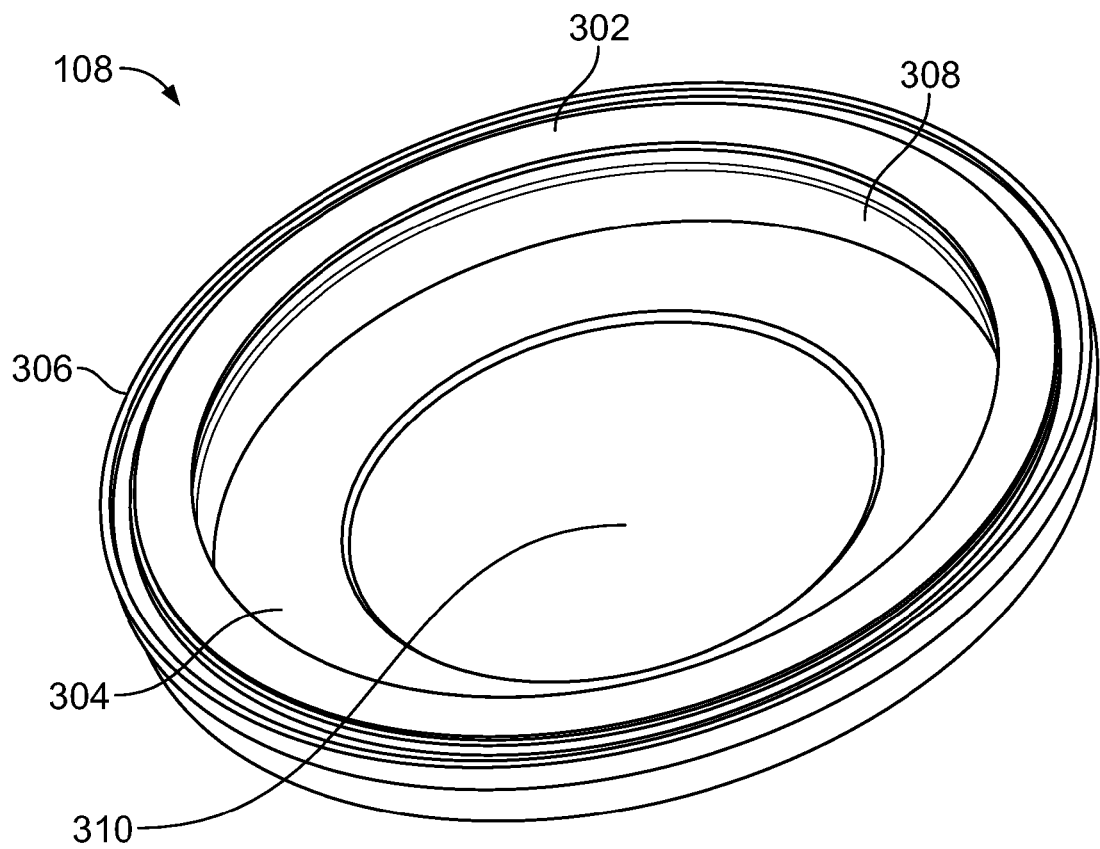
FIG. 2 shows a perspective view of an extended anode for use in a physical vapor deposition apparatus.

Referring to FIGS. 1A, 1B, 1C, and 2, the anode 108 can have an annular body 302 and can be extended by an annular flange 304 projecting inwardly from the annular body 302. The annular flange 304 can define an intended discharge space 128 (see FIG. 1A) in which plasma can be retained during the PVD process. As shown in FIGS. 1C and 2, the annular body 302 can comprise an upper portion 306 and a lower portion 308. The upper portion 306 can be closer to the cathode 106 than the lower portion 308. The spacing 148 (see FIGS. 1A, 1B) between the upper portion 306 and the top surface 154 of vacuum chamber 102 can be configured to prevent plasma formation therebetween.

Shown in FIG. 1C, a top portion 320 of the upper portion 306 of the anode can extend vertically, e.g., it can be a cylinder, from the top surface 154 of the vacuum chamber. The top portion 320 can be parallel to and surround edge 160 of target 126. A bottom portion 322 of the upper portion 306 can extend, e.g. perpendicularly, inwardly from an inside surface at the bottom edge of top portion 320. Bottom portion 322 can extend substantially horizontally inwardly, e.g., as a horizontal ring. The inner radius of the ring 322 can have approximately the same radius as the outer edge 160 of the target 126. Lower portion 308 can extend from a lower surface and an inner edge of bottom portion 322. Lower portion 308 can extend perpendicularly from bottom portion 322 and can extend vertically, e.g. as a cylinder. An inside wall of the cylinder can have approximately the same radius as the outer edge 160 of the target 126. Although not shown, another projection can extend downwardly from the lower surface of bottom portion 322 near the outside edge such that a gap is formed for the placement of an upper portion of shield 124.

Figure 3A:
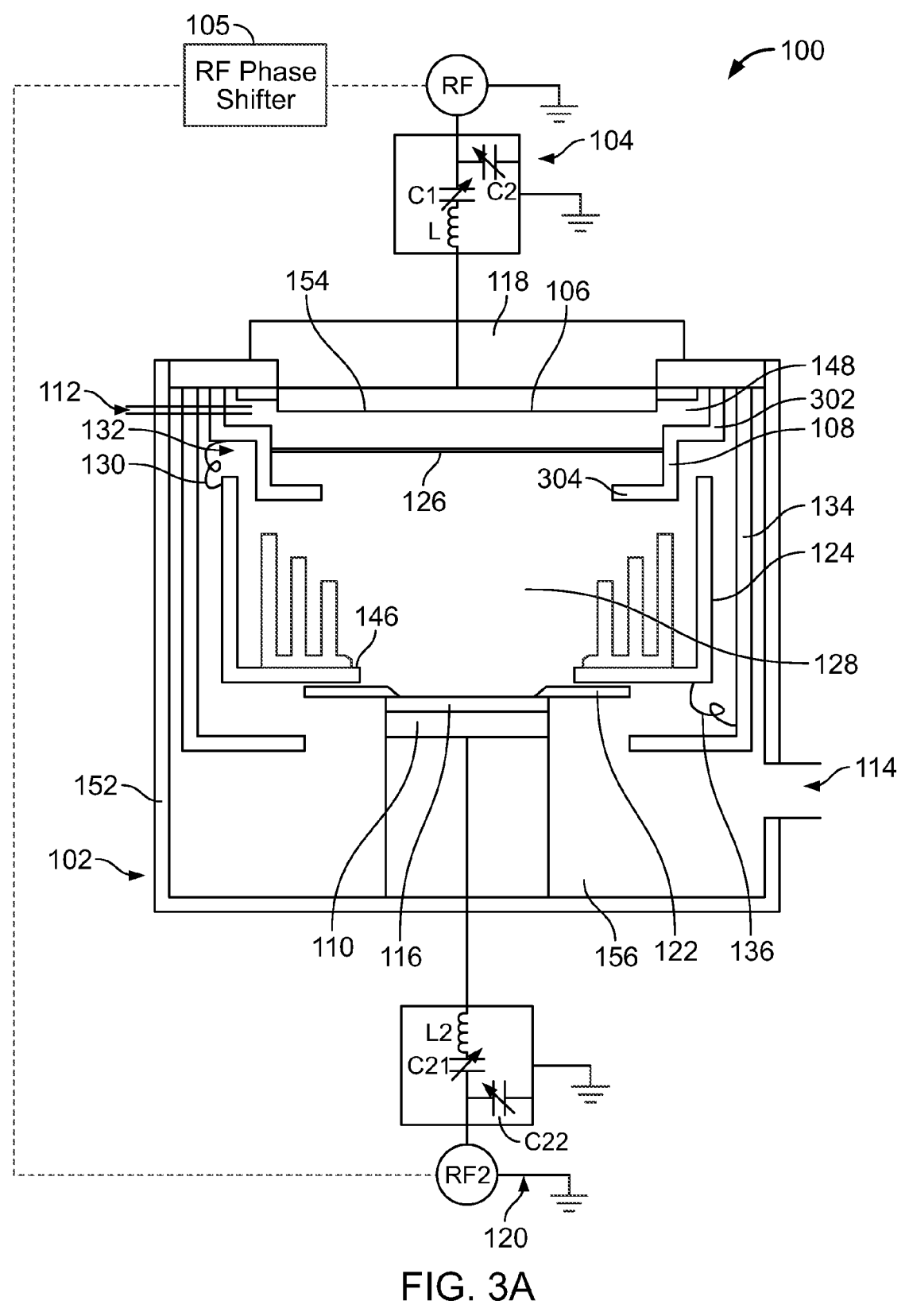
Figure 3B:
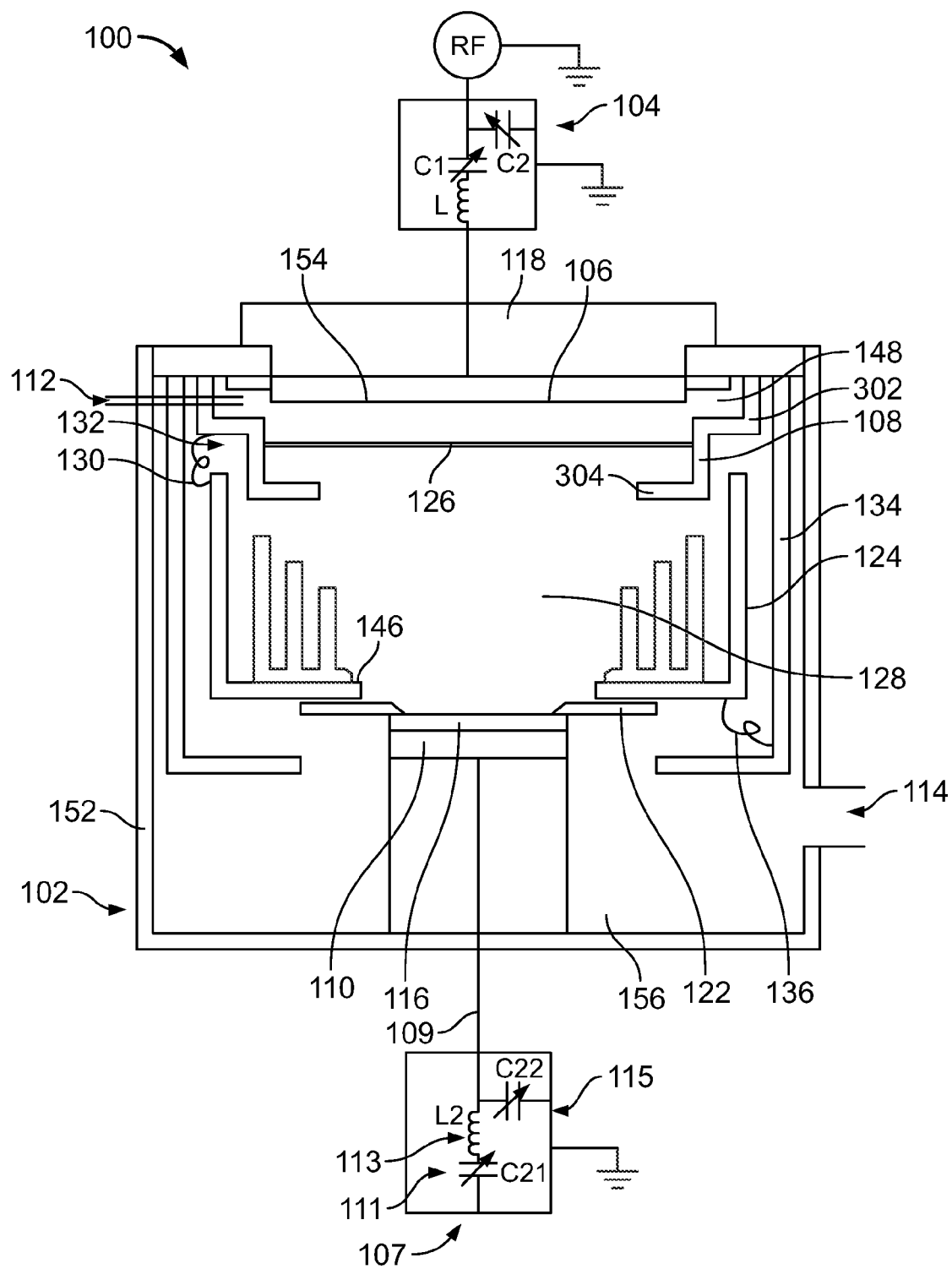
FIG. 3B is a schematic of a cross-section of an embodiment of a physical vapor deposition apparatus including an impedance matching network and an extended shield.
Figure 3C:
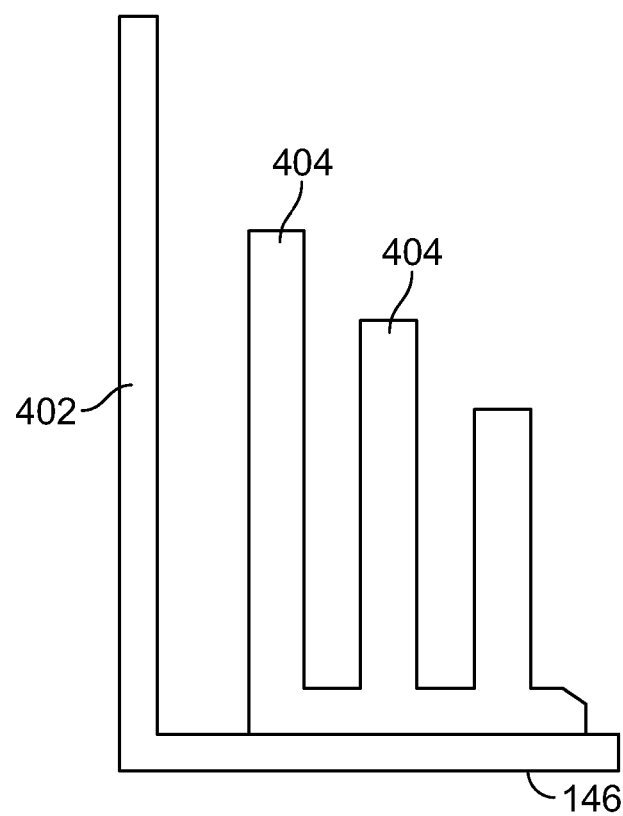
FIG. 3C is an enlarged view of the extended shield of FIGS. 3A and 3B.

The annular flange 304 can project inwardly from the lower portion 308 such that at least some of the flange extends below target 126. As shown in FIG. 1A, the flange 304 can extend inwardly and downwardly from the annular body 302 such that the radius of the flange 304 closer to the cathode 106 is larger than the radius of the flange 304 further from the cathode 106, i.e. the flange can have a funnel shape. Alternatively, as shown in FIGS. 3A and 3B, the flange 304 can extend horizontally from the annular body 302. In some embodiments, the flange 304 extends from the lowermost edge of the lower portion 308.

An annular opening 310 (see FIG. 2) can have approximately the same radius as the chuck 110 such that there is no substantial shadowing of the substrate 116 during the PVD process, i.e. such that the entire top surface of substrate 116 can be covered with a thin film.

The vacuum chamber 102 can also include an RF shield 124 to protect the sidewalls of vacuum chamber 102 from being coated with thin film material. The shield 124 can be made, for example, of non-magnetic stainless steel or aluminum and can be grounded to the sidewalls 152 of the vacuum chamber 102.

In some implementations, shown in FIGS. 1A and 1B, the shield 124 can include an annular body 402 that extends vertically, e.g. in a cylindrical shape. A horizontally extending flange 146 can extend inwardly from a bottom edge of the annular body 402. The horizontally extending flange 146 can be located near the bottom of the vacuum chamber 102 and can extend past the flange 304 to surround and partially vertically overlap the lower portion 308 of the anode 108. In some embodiments, the vertically extending flange 146 can extend into a gap between the lower portion 308 of the anode 108 and substrate holding mechanism 122. The flange 146 can partially horizontally overlap the substrate holding mechanism 122.

Figure 4:
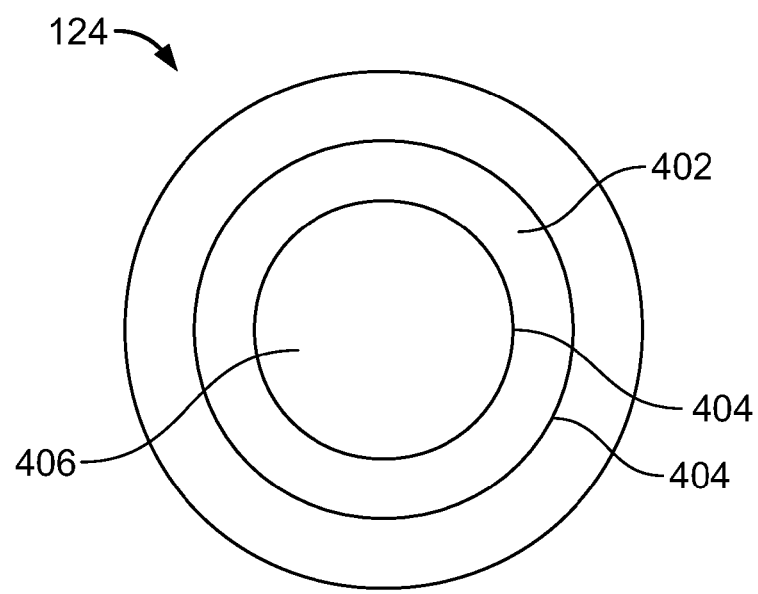
FIG. 4 is a schematic view of the top of an extended shield for use in a physical vapor deposition apparatus.

The annular opening 406 (see FIG. 4) inside the annular flange 146 of the shield 124 can have approximately the same radius as the chuck such that there is no substantial shadowing of the substrate 116. A gap 132 can exist between the shield 124 and the anode 108 in order to permit process gas to be evacuated from the intended discharge space 128.

In some embodiments, shown in FIGS. 3A, 3B, 3C, and 4, the shield can be extended such that a set of concentric annular projections 404 extends from the annular flange 146, for example towards the cathode 106. The annular projections 404 can extend parallel to annular body 402. As shown in FIGS. 3A and 3B, the height of the annular projections 404 can increase along a radius from the center of the vacuum chamber 102 to the sidewalls 152. The annular body 402 can have a height that is taller than the height of the annular projections 404.

The physical vapor deposition apparatus 100 can further include an electrically conductive body 130, for example a strap, that directly connects the anode 108 and the shield 124. The electrically conductive body 130 can be flexible and can be configured to permit gas flow between the anode 108 and shield 124. For example, the electrically conductive body 130 can be a mesh or a wire strap. The electrically conductive body 130 can be made, for example, of copper or aluminum.

There can be a number of connections between the anode 108 and shield 124. For example, the electrically conductive body 130 can be connected to the anode 108 and the shield 124 at at least four points. The electrically conductive body 130 can be connected between a lower surface of the anode 108 and a top portion of the shield 124. The electrically conductive body 130 can also be connected between a top portion of the anode 108 and an outer surface of the shield 124.

The physical vapor deposition apparatus 100 can further include a secondary chamber shield 134. The chamber shield can be made of, for example, non-magnetic stainless steel or aluminum. An upper portion of the chamber shield can be positioned between the anode 108 and the sidewalls of the vacuum chamber 102. A lower portion of the chamber shield 134 can be positioned between the sidewalls of the vacuum chamber 102 and shield 124. The chamber shield 134 can be concentric with and surround shield 124 and/or anode 108. The height of the chamber shield 134 can be equal to or greater than the height of shield 124. The chamber shield 134 can include a vertical annular body 142 and an annular flange 144 extending inwardly from the annular body 142, e.g., from the lower edge of the vertical annular body 142. The annular flange 144 of the chamber shield 134 can extend below the annular flange 146 of shield 124, but can have a radial length that is shorter than the annular flange 146. The annular flange 144 can be closer to the bottom of the chamber than the chuck 110. The inner edge of the flange 144 of the chamber shield can be vertically aligned with the outer edge of the chuck 110.

The chamber shield 130 can be configured such that process gases may still be pumped into and out of the vacuum chamber 102. For example, the chamber shield 134 may be short enough so as not to cover the gas inlet 142 or the vacuum outlet 114. Alternatively, the chamber shield 134 may have holes (not shown) in locations corresponding to the locations of gas inlet 142 and vacuum outlet 114. Furthermore, the chamber shield 134 can be separately removable and can be cleaned easily and reused over time.

The chamber shield 134 can be electrically bonded to shield 124 with an electrically conductive body 136. The electrically conductive body 136 can be of similar material and shape as electrically conductive body 130. Thus, the electrically conductive body 136 can be configured to permit gas flow between shield 124 and chamber shield 134. Likewise, the electrically conductive body 136 can be composed of mesh, can be one or more straps, and can comprise copper or aluminum. Moreover, the electrically conductive body 136 can be connected between a bottom surface of shield 124 and an inner surface of chamber shield 134.

The physical vapor deposition apparatus 100 can further include a process gas inlet 112, process gas control devices (not shown), a vacuum outlet 114, pressure measurement and control devices (not shown), and vacuum pumps (not shown).

During the sputtering or PVD process, gases, such as argon and oxygen, are supplied through the process gas inlet 112 at a flow rate ratio (argon/oxygen) of 10-200 sccm/0.2 to 4 sccm, such as 10 to 60 sccm/0.5 to 2 sccm. A vacuum pump (not shown) maintains a base vacuum, for example, of 10-7 Torr or below, and a plasma operation pressure, for example, of 0.5 mTorr to 20 mTorr, particularly 4 mTorr, through vacuum outlet 114. When the RF power from RF power supply 104 is applied on the order of 500 W to 5,000 W, for example 2000W to 4,000 W, or 3000 W, to the cathode assembly 106, the target 126 is negatively biased and the anode 108 is positively biased, causing plasma to form in the intended discharge space 128 between the cathode 106 and the anode 108. The magnetron assembly 118 creates a magnetic field of, for example, 50 Gauss to 400 Gauss, such as 200 Gauss to 300 Gauss, at and near the front surface of the cathode 106. The magnetic field confines the electrons to a helical motion parallel to the front surface of target 126.

The negative selfbias DC voltage on target 126, in conjunction with the electrons confined near the surface of target 126 by the magnetic field, facilitates bombardment of the target 126 by energetic positive ions of the plasma. Momentum transfer causes neutral target material, such as PZT molecules, to dislocate from the target 126 and deposit on substrate 116, creating a thin film on substrate 116. The resulting thin film can have a thickness of 2000 Å to 10 μm, for example 2-4 μm.

Figure 5:
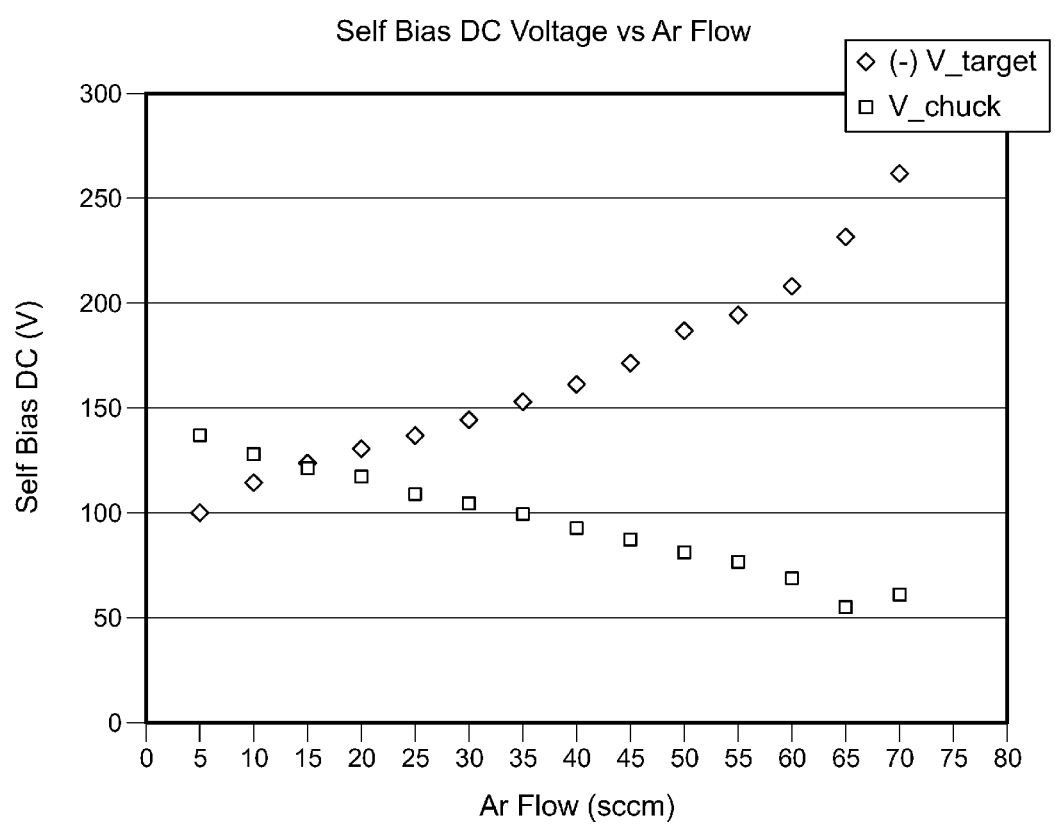
FIG. 5 is an example graph of self bias DC voltage vs. air flow for a chuck and a cathode.

In the embodiment shown in FIGS. 1A and 3A, when RF power supply 120 is applied to substrate 116, a DC self bias can develop on the substrate. RF Phase shifter 105 can be used to adjust the phases, e.g. the current or voltage phase, of the RF signal applied by RF power supply 104 and/or RF power supply 120. The RF phase shifter 105 can lock the respective phases such that the difference in phase, e.g. from 0° to 369°, creates the desired DC self bias on the substrate, which can have a negative, positive, or zero charge, for example −300V to +300V, in particular −100V to +100V. As an example, a graph of a positive self bias of a substrate vs. gas flow is shown in FIG. 5.

The charge of the DC self bias can be controlled by the amount of RF power applied to substrate 116 in addition to the difference in phase. If low RF power, e.g. less than 50 W, such as less than 2 W, is applied to chuck 110, and the phase is locked, e.g., between 190° and 240°, such as 220°, a time-average positive DC self bias, e.g. of 10V-100V, such as 60V, can develop on substrate 116. A positive voltage results in attracting and accelerating electrons from the plasma to the surface of substrate 116. Those electrons with sufficient energies will cause modification of the sputtered material properties without causing any substantial re-sputtering due to their low momentum. Moreover, a positive voltage can prevent plasma ions from bombarding the surface of substrate 116 and thus avoid etching of the surface. In contrast, if a higher RF power is applied to the substrate, e.g. greater than 50 W, and the phase is locked at, for example, below 190° or above 240°, such as below 180° or above 270°, a negative DC self bias can develop on substrate 116. A negative voltage can cause plasma ions to be attracted and accelerated towards the substrate, which can result in re-sputtering of the surface. Re-sputtering can be useful, for example, for etching the substrate surface. For a given implementation, such as chamber configuration, gas composition and flow rate, pressure, magnetic field, and voltage, experimentation may be required to obtain the phase shift necessary to generate a positive or negative self bias voltage on the substrate 116.

Figure 6A:
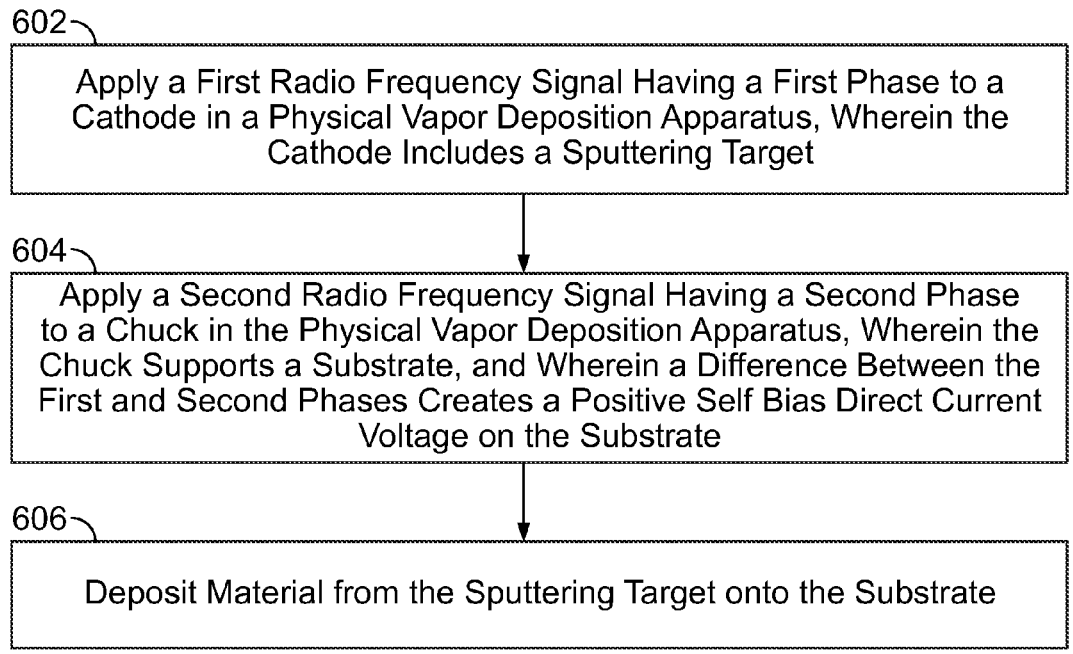
FIG. 6A is an example flow chart of a process for depositing a thin film on a substrate using a physical vapor deposition having a phase shifter connected between a cathode power supply and a chuck power supply.

A flow chart for a process of forming a thin film using the apparatus of FIGS. 1A and 3A is shown in FIG. 6A. At 602, a first radio frequency signal having a first phase is applied to a cathode in a physical vapor deposition apparatus. The cathode can include a sputtering target. At 604, a second radio frequency signal having a second phase is applied to a chuck supporting a substrate in the physical vapor deposition apparatus. The difference between the first and second phases creates a positive self bias DC voltage on the substrate. At 606, material from the sputtering target is deposited onto the substrate.

In the embodiment shown in FIGS. 1B and 3B, when RF power supply 104 is applied to cathode 106, and an impedance matching network 107 is connected to the chuck 110, a DC self bias can develop on the substrate. The capacitances of the variable tune capacitor 111 and/or the shunt capacitor 115 can be selected or adjusted, for example to between 10 pF and 500 pF, such that the desired DC self bias is developed on the substrate. As in the embodiment described above, the substrate can have a resulting a negative, positive, or zero charge, for example −300V to +300V, in particular −100V to +100V.

Figure 6B:
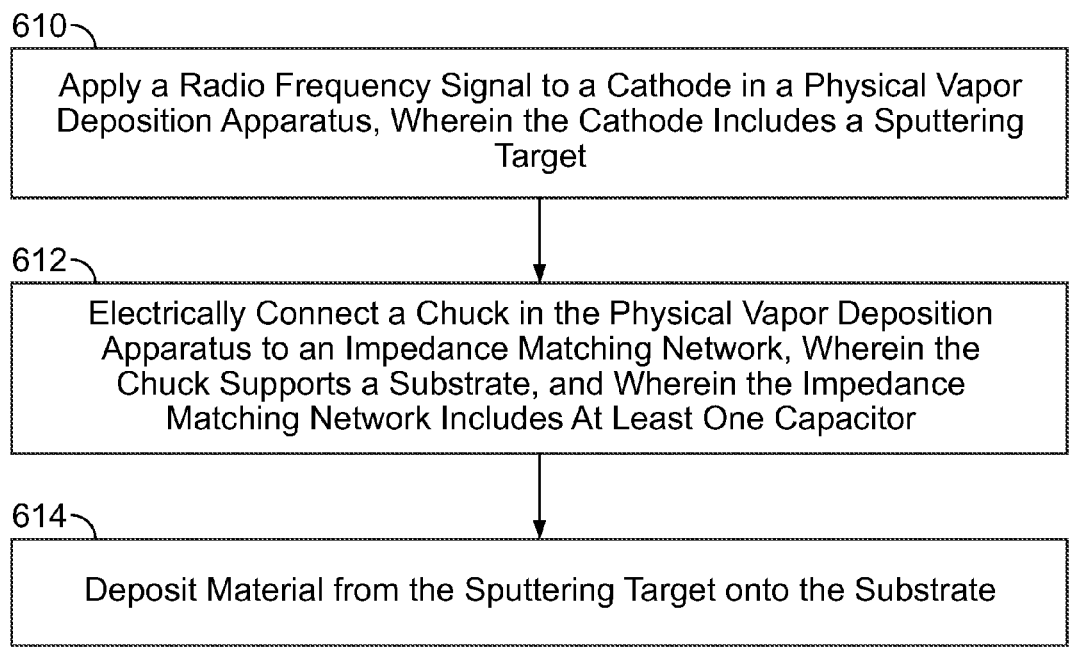
FIG. 6B is an example flow chart of a process for depositing a thin film on a substrate using a physical vapor deposition having an impedance matching network connected to a chuck.

A flow chart for a process of forming a thin film using the apparatus of FIGS. 1B and 3B is shown in FIG. 6B. At 610, a radio frequency signal is applied to a cathode in a physical vapor deposition apparatus. The cathode includes a sputtering target. At 612, a chuck supporting a substrate in the physical vapor deposition apparatus is electrically connected to an impedance matching network. The impedance matching network includes at least one capacitor. At 614, material from the sputtering target is deposited onto the substrate. Although not shown in FIG. 6, the process can further include selecting or adjusting a capacitance of the capacitors such that a positive self bias DC voltage is generated on the substrate.

Use of either an RF phase shifter or an impedance matching network in a physical vapor deposition apparatus can be particularly advantageous for the creation of piezoelectric thin films, such as PZT thin films. In particular, use of a phase shifter 105 or an impedance matching network 107 to create an indirect bias on the substrate or deposited film is advantageous because an external DC bias cannot be directly applied to a dielectric material such as PZT. Furthermore, both the RF phase shifter 105 and impedance matching network 107 can modify the electric field strength in the dark space between substrate 116 and the intended discharge space 128, thereby changing the re-sputtering effects of the deposition process. In contrast, while directly biasing a substrate can shift the overall system voltages into an offset value to both the target and/or the substrate, it cannot modify the dark space between substrate 116 and the intended discharge space 128.

If PZT films are sputtered using a physical vapor deposition apparatus having a substrate with a positive DC self bias as described herein, the electrons that are attracted to the surface of the substrate can cause electron heating, which can increase the mobility of the thin films atoms. Further, the electrons on the surface can help reject plasma ions from the surface to avoid re-sputtering of the surface. As a result, a film having a preferable structure, for example, a thin film having a (100) crystalline structure, can be formed. Such films sputtered on a substrate having a positive DC self bias, for example a PZT film having a Perovskite PZT (100)/(200) crystal orientation, can have advantageous dielectric and piezoelectric properties, such as a dielectric constant in the range of 1000 to 1700, a high d31 coefficient, and a high break-down voltage. For example, PZT thin films having a (100) crystal orientation can be used as MEMS devices, such as actuators for ink dispensing devices.

A number of embodiments have been described. Nevertheless, it will be understood that various modifications may be made without departing from the spirit and scope of what is described. For example, it should be understood that terms of positioning and orientation (e.g., top, vertical) have been used to describe the relative positioning and orientation of components within the physical vapor deposition apparatus, but the physical vapor deposition apparatus itself can be held in a vertical or horizontal orientation or some other orientation. As another example, the steps of the exemplary flow chart of FIGS. 6A, 6B may be performed in other orders, some steps may be removed, and other steps may be added. Accordingly, other embodiments are within the scope of the following claims.

What is claimed is:

1. A method of physical vapor deposition comprising:
   applying, using a first radio frequency power source, a radio frequency signal to a cathode in a vacuum chamber of a physical vapor deposition apparatus, wherein the cathode includes a dielectric sputtering target;
   electrically connecting a chuck in the physical vapor deposition apparatus to an impedance matching network, wherein the chuck supports a dielectric substrate, and wherein the impedance matching network includes at least one capacitor;
   configuring the impedance matching network such that a positive self bias direct current voltage is generated on the dielectric substrate, wherein the positive self bias direct current voltage is between 10V and 100V; and
   depositing material from the dielectric sputtering target onto the dielectric substrate.

2. The method of claim 1, wherein the impedance matching network includes a variable tune capacitor and wherein configuring the impedance matching network comprises adjusting a capacitance of the variable tune capacitor such that the positive self bias direct current voltage is generated on the dielectric substrate.

3. The method of claim 2, wherein the adjusting the capacitance comprises adjusting the capacitance to have a magnitude of between 10 pF and 500 pF.

4. The method of claim 1, wherein the positive self bias direct current voltage is approximately 60V.

5. The method of claim 1, wherein configuring the impedance matching network comprises selecting a capacitance for the at least one capacitor such that the positive self bias direct current voltage is generated on the dielectric substrate.

6. The method of claim 5, wherein the capacitance is selected to be between 10 pF and 500 pF.

7. The method of claim 5, wherein the positive self bias direct current voltage is approximately 60V.

8. The method of claim 1, wherein the radio frequency signal has a radio frequency power having a magnitude of between 1000 W and 5000 W.

9. The method of claim 8, wherein the radio frequency power has a magnitude of approximately 3000 W.

10. The method of claim 1, wherein the dielectric sputtering target comprises lead zirconate titanate ("PZT").

11. The method of claim 1, wherein depositing the material from the dielectric sputtering target onto the substrate comprises creating a dielectric thin film having a thickness of between 2000 Å and 10 μm.

12. The method of claim 11, wherein the dielectric thin film has a thickness of between 2 μm and 4 μm.

13. The method of claim 1, wherein depositing the material from the dielectric sputtering target onto the dielectric substrate comprises creating a dielectric thin film having a (100) crystalline structure.

14. The method of claim 1, wherein the impedance matching network does not receive power from any radio frequency power source through a current path external to the vacuum chamber of the physical vapor deposition apparatus.

15. A physical vapor deposition apparatus comprising:
    a vacuum chamber having side walls;
    a cathode inside the vacuum chamber, wherein the cathode is configured to include a dielectric sputtering target;
    a radio frequency power supply configured to apply a radio frequency signal to the cathode;
    an anode inside and electrically connected to the side walls of the vacuum chamber;
    an impedance matching network; and
    a chuck inside the vacuum chamber, wherein the chuck is configured to support a dielectric substrate and the chuck is electrically connected to the impedance matching network, and wherein the impedance matching network is configured such that a positive self bias direct current voltage is generated on the dielectric substrate when the radio frequency signal is applied to the cathode by the radio frequency power supply, wherein the positive self bias direct current voltage is between 10V and 100V.

16. The apparatus of claim 15, wherein the impedance matching network comprises at least one capacitor.

17. The apparatus of claim 16, wherein the impedance matching network comprises:
    an input terminal electrically connected to the chuck;
    a first capacitor electrically connected to ground;
    an inductor electrically connected between the input terminal and the first capacitor; and
    a second capacitor electrically connected between the input terminal and ground, the second capacitor being in parallel with the inductor and the first capacitor.

18. The apparatus of claim 15, wherein the impedance matching network comprises a variable tune capacitor and a shunt capacitor.

19. The apparatus of claim 15, wherein the dielectric sputtering target comprises lead zirconate titanate ("PZT").

20. The apparatus of claim 15, wherein the cathode further comprises a magnetron assembly.

21. The physical vapor deposition apparatus of claim 15, wherein the impedance matching network does not receive power from any radio frequency power source through a current path external to the vacuum chamber of the physical vapor deposition apparatus.

* * * * *